United States Patent [19]
Mohindra

[11] Patent Number: 5,584,068
[45] Date of Patent: Dec. 10, 1996

[54] DIRECT CONVERSION RECEIVER

[75] Inventor: Rishi Mohindra, Eindhoven, Netherlands

[73] Assignee: U.S. Philips Corporation, New York, N.Y.

[21] Appl. No.: 520,330

[22] Filed: Aug. 28, 1995

Related U.S. Application Data

[63] Continuation of Ser. No. 148,105, Nov. 3, 1993, abandoned.

[30] Foreign Application Priority Data

Nov. 26, 1992 [EP] European Pat. Off. ............ 92203653

[51] Int. Cl.$^6$ ..................................................... H04B 1/26
[52] U.S. Cl. ................... 455/324; 455/182.2; 455/192.2; 375/344
[58] Field of Search ............................ 455/182.1, 182.2, 455/183.1, 183.2, 192.1, 192.2, 257, 259, 260, 265, 324, 256; 375/97, 80, 83, 84, 81

[56] References Cited

U.S. PATENT DOCUMENTS

| | | | |
|---|---|---|---|
| 4,344,178 | 8/1982 | Waters | 375/81 |
| 4,672,636 | 6/1987 | Marshall et al. | 375/88 |
| 4,871,975 | 10/1989 | Nawata et al. | 329/124 |
| 4,989,220 | 1/1991 | Serrone | 375/83 |
| 5,179,578 | 1/1993 | Ishizu | 375/86 |
| 5,365,185 | 11/1994 | Bar-David | 329/308 |
| 5,438,692 | 8/1995 | Mohindra | 455/324 |

FOREIGN PATENT DOCUMENTS

| | | |
|---|---|---|
| 0298484 | 2/1992 | European Pat. Off. . |
| 2180419 | 3/1987 | United Kingdom . |

*Primary Examiner*—Andrew Faile
*Assistant Examiner*—Lee Nguyen
*Attorney, Agent, or Firm*—Michael E. Marion

[57] ABSTRACT

A direct conversion receiver for FSK modulated digital signals has two quadrature signal paths (I, Q) and an a.f.c. loop for controlling a local frequency generator. A control signal for the a.f.c. loop is produced by an offset frequency detector, and is in the form of a unipolar series of pulses having an average value which is proportional to the offset of the local frequency with respect to the carrier frequency of the signal being received. The offset frequency detector derives such control signal based on the difference between phase-shifted cross-products of the signals in the I and Q paths. This achieves fast a.f.c. loop response, improving the performance of the receiver, and permits a simpler loop filter for achieving the requisite signal averaging. The receiver also includes an out-of-range detector for detecting when the local frequency is outside a predetermined window with respect to the carrier frequency of the received signal, in which case the a.f.c. control signal is derived from the average level of data in the received signal rather than from the offset frequency detector.

8 Claims, 4 Drawing Sheets

DIRECT CONVERSION RECEIVER

This is a continuation of application Ser. No. 08/148,105 filed Nov. 3, 1993 abandoned.

BACKGROUND OF THE INVENTION

1. Related Application

This application is related to Applicant's copending application Ser. No. 133,546, filed Oct. 2, 1993, PHN 14,285, assigned to the same assignee.

2. Field of the Invention

The present invention relates to a direct conversion receiver comprising a local frequency generating arrangement which is coupled to a pair of quadrature related mixers for mixing down an rf input signal to quadrature related signals, and a.f.c. means for providing a control signal for the local frequency generating arrangement, the a.f.c. means, which are coupled to quadrature paths, comprising a frequency offset detector for deriving a frequency control signal having an average value which is proportional to the frequency offset of the local frequency generating arrangement with respect to the rf input signal. The frequency offset detector comprises a series arrangement of a phase shifting arrangement and a multiplication arrangement in a quadrature path. Such direct conversion, receivers can be digital paging receivers or transceivers using an FSK (Frequency Shift Keying) modulation scheme, but also transceivers for cordless telephony or the like.

3. Description of the Related Art

A direct conversion receiver of this kind is known from the European Patent EP 298 484 B 1. In the known direct conversion receiver, which is an optical receiver, an a.f.c. (automatic frequency control) signal for a local oscillator with inherent correct polarity is derived from so-called I- and Q-channel receiver paths. For this purpose, a baseband I-channel signal is fed to a frequency offset detector, together with a quadrature related Q-channel signal. The frequency offset detector is a series arrangement of a phase shifting arrangement and a multiplication arrangement, whereby the I-channel signal is fed to an input of the multiplication arrangement, and the Q-channel signal is fed to another input of the multiplication arrangement via the phase shifting arrangement. The output signal of the detector is used as a control signal which is fed to the local oscillator via a low pass filter. In the known receiver the control signal is a bipolar signal, which is subject to a relatively strong low frequency ripple component.

SUMMARY OF THE INVENTION

It is an object of the present invention to provide a direct conversion receiver having an improved performance, and imposing less demand upon signal averaging in the low pass loop filter.

To this end a direct conversion receiver according to the present invention is charactetised in that the frequency detector comprises a further series arrangement of a phase shifting arrangement and a multiplication arrangement in another quadrature path, and a subtracting the arrangement for subtracting output signals of the two multiplication arrangements, whereby inputs of the multiplication arrangements are cross-coupled to the quadrature paths, and other inputs of the multiplication arrangements are coupled to the quadrature paths via the phase shifting arrangements. In the receiver according to the present invention the control signal comprises a considerable higher tipple frequency component as compared with the known receiver, and so a succeeding low pass filter for filtering the control signal can have a much higher cut-off frequency. Consequently the a.f.c. loop has a faster response, which is advantageous for quick frequency lock and also for scanning frequency channels. For an appropriate response the filter cut-off frequency should not become too low with respect to the ripple frequency of the control signal i.e. a trade-off has to be made between a fast loop response and a clean a.f.c. signal. When using a direct conversion receiver according to the present invention e.g. as an FSK data paging receiver for high frequencies such as in the 900 MHz band, use of expensive temperature compensating schemes for compensating frequency drift of a crystal oscillator in such a receiver as is necessary in conventional paging receivers, is also avoided.

Although the phase shifting arrangement and the multiplication arrangement can be implemented by using analog circuits, in a simple embodiment the phase shifting arrangement is a shift register and the multiplication arrangement is an exclusive-OR. In such an embodiment, the phase shifting arrangement has a phase shift proportional to frequency, i.e. is a time delay arrangement.

An alternative embodiment of a direct conversion receiver according to the present invention comprises a microcontroller functionally implementing the series arrangements and the subtracting arrangement, and digital-to-analog conversion means and/or digital output means for providing the control signal. Such an embodiment is particularly advantageous if the direct conversion receiver comprises a microcontroller with digital I/O-channels and/or a digital-to-analog converter for other purposes, and such resources can be shared for implementing the present invention. The shared resources can be multiplexed, then.

In a further embodiment of a direct conversion receiver according to the present invention, the control signal is fed to the local oscillator via an analog or digital integrator or via an analog or digital low pass filter. Thus, the a.f.c. loop dynamics can be easily controlled. Using an integrator achieves a zero steady state response. The digital embodiment is particularly advantageous if microcontroller resources can be shared, as mentioned above.

For a.f.c. range extension, the direct conversion receiver according to the present invention comprises a data demodulation arrangement in parallel with the offset frequency detector for providing data from the quadrature related baseband signals, a data filter for providing filtered data, and an out-of-range decision arrangement coupled to the data filter via an averaging filter. The decision arrangement controls a switching arrangement for switching an output signal of the offset frequency detector as the control signal, or the filtered data as the control signal. Such a range extension, e.g. in an FSK receiver, is necessary if the frequency of the local oscillator drifts close to or beyond the frequency deviation of the received r.f. FSK data signal. The out-of-range decision arrangement, which can be a window comparison arrangement, detects such an out-of-range condition, and the filtered data is taken as an a.f.c. control signal instead of an output signal of the offset frequency detector. Such an out-of-range detection is particularly effective if the number of ones and zeroes in the FSK signal is approximately equal, on the average. The out-of-range detection can also be a software based decision arrangement implemented with a microcontroller, which checks data validity or other signal parameters like signal frequency for taking an out-of-range decision. In case of checking signal frequencies, checking a frequency of the product signal of the I and Q channels, i.e. checking a double frequency, achieved more accurate measurement than checking the frequency of an I or Q channel alone. Checking data validity can be based on a valid CRC (Cyclic Redundancy Code), a BER (Bit Error Rate), or the like.

An embodiment of a direct conversion device according to the present invention comprises bandpass filters in the respective quadrature paths, wherein for a.f.c. out-of-range extension the bandpass filters are stopband filters stopping a band substantially from DC, or wherein for out-of-range extension the direct conversion receiver comprises highpass filters coupled to the quadrature paths, whereby the combined bandpass and highpass filters form stopband filters, and wherein the phase shifting arrangements have a non-linear shifting characteristic approaching a predetermined phase shift with increasing frequency. The stopband or frequency gap is chosen such that for a zero offset frequency, the received signal frequency just falls outside the gap, whereas for an offset beyond the frequency deviation of the input rf signal one of the FSK data "0" and "1" frequencies falls inside the gap. It is thus achieved that the gap suppresses a signal that would otherwise pull the a.f.c. into the wrong direction.

An embodiment of a direct conversion device according to the present invention comprises filters in the respective quadrature paths, wherein for a.f.c. out-of-range extension the phase shifting arrangements have a non-linear phase shifting characteristic changing from a first predetermined phase shift to a second predetermined phase shift with increasing baseband frequency around a predetermined baseband frequency (which could also be Δf, Δf being a frequency deviation). Thus always a correct polarity a.f.c. signal is achieved. For a frequency offset beyond twice the frequency deviation both a correct polarity and non-reduced a.f.c. loop gain is achieved, whereas for a lower offset some a.f.c. loop gain reduction occurs.

BRIEF DESCRIPTION OF THE DRAWINGS

The present invention will now be described, by way of example, with reference to the accompanying drawings, wherein FIG. 1 schematically shows a direct conversion receiver according to the present invention.

DESCRIPTION OF THE PREFERRED EMBODIMENTS

Figure 1:
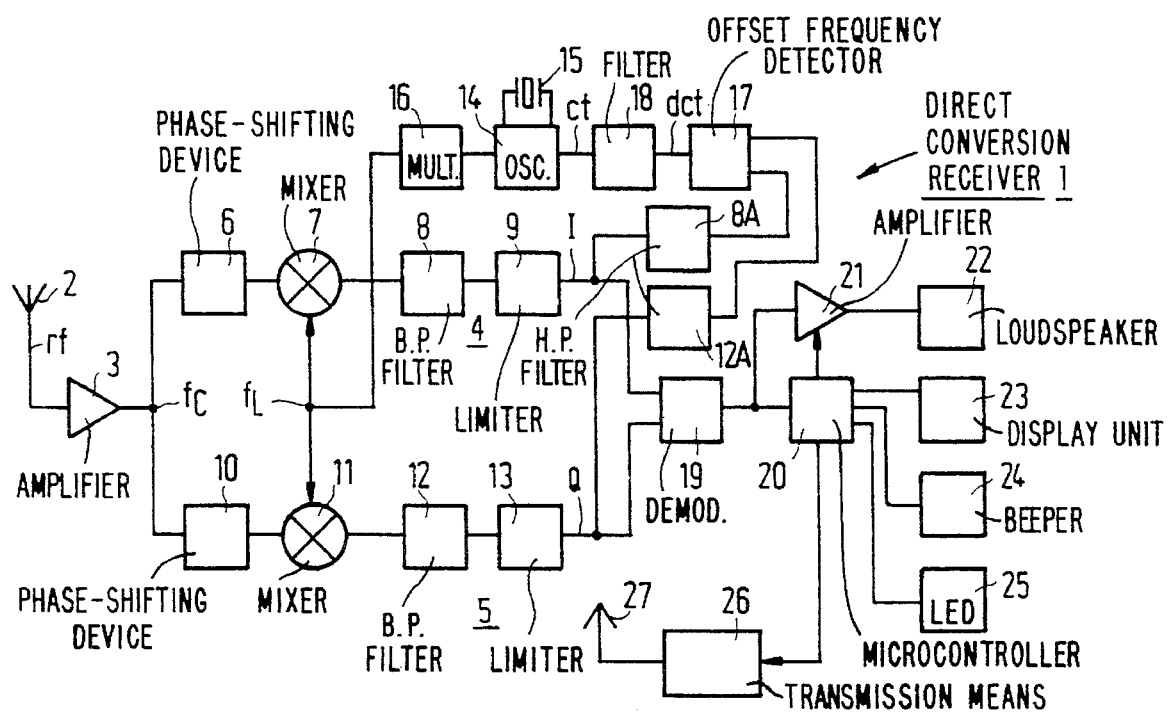

FIG. 1 schematically shows a direct conversion receiver 1 according to the present invention. The direct conversion receiver 1, which can be a paging transceiver, comprises an antenna 2 for receiving an rf (radio frequency) input signal rf, which can be an rf FSK (Frequency Shift Keying) signal carrying FSK modulated digital signals. The rf input signal rf is fed to a low noise rf amplifier 3, which is coupled to quadrature paths 4 and 5, so-called I- and Q-channels, for mixing down the rf input signal rf to quadrature related baseband signals I and Q. The quadrature path 4 comprises a phase shifting device 6 causing a +45 degrees phase shift of the amplified rf signal. The phase shifting device 6 is coupled to a mixer 7 for mixing down the rf signal rf to the baseband signal I, an output of the mixer 7 being filtered and limited by means of a respective filter 8 and a limiter 9. Similarly, the quadrature path 5 comprises a phase shifting device 10 causing a −45 degrees phase shift of the amplified rf signal, a mixer 11, a filter 12, and a limiter 13 for achieving the baseband signal Q. The filters 8 and 12 are provided for limiting the noise bandwidth and for channel selectivity. By AC-coupling of the filters 8 and 12 to the mixers 7 and 11, DC-offset effects are avoided. The limiters 9 and 13 are provided for removing amplitude signal variations. The mixers 7 and 11 are further coupled to a local frequency generating arrangement, e.g. a crystal oscillator 14 having a crystal 15 as a frequency determining element, via a frequency multiplication arrangement 16. The local frequency generating arrangement 14 can also be a more elaborate arrangement, e.g. a frequency synthesizer having a crystal oscillator for providing a reference frequency. Such frequency synthesizers can operate on the basis of a PLL (Phase Locked Loop). In a direct conversion receiver the mixing frequency, i.e. an output frequency $f_L$ of the multiplication arrangement 16, further denoted as oscillator frequency, is chosen such that baseband zero-intermediate frequency signals I and Q are obtained, for a fictitious carrier $f_c$. Instead of two phase shifting devices, with +45 degrees and −45 degrees phase shifting, respectively, a single 90 degrees phase shifting device can be applied, for phase shifting the oscillator signal for one of the mixer signals. For example for FSK modulated rf signals with a frequency deviation of +4 kHz and −4 kHz around a 900 MHz carrier frequency $f_c$, the carder not physically being present in the received rf input signal rf, representing logical "0" and logical "1" transmitted signals, the baseband signals I and Q are 4 kHz signals, though differing in phase, if $f_L=f_c$. In case of a frequency offset of the oscillator frequency $f_L$ with respect to the rf input signal rf, and so also with respect to the carrier frequency $f_c$, the baseband signals I and Q have different frequencies. According to the present invention, the direct conversion receiver 1 comprises a.f.c. means coupled to the quadrature paths 4 and 5 comprising an offset frequency detector 17 for delivering a signal dct as an a.f.c. control signal for the local oscillator 14, a DC (Direct Current) component of the signal dct being proportional to the frequency offset $f_L-f_c$. The frequency detector 17 comprises two series arrangements of a phase shifting arrangement and a multiplication arrangement, and also a subtracting or adding arrangement, to be described in detail with reference to FIG. 2. The signal dct is fed to the local oscillator 14 via a smoothing arrangement 18, being an analog or digital integrator, or the analog or digital low pass filter, i.e. an actual control signal ct being the smoothed signal dct. The signal dot can be an analog or digital signal, depending whether or not the quadrature paths comprise limiters. Poles and zeroes of the smoothing arrangement 18 or smoothing filter determine the a.f.c. loop dynamics. From the practical point of view, a filter cut-off frequency could be in a range between a ripple frequency of the digital signal dot divided by 1000, and the frequency of the digital signal dot divided by 20, a trade-off being made between a noisy, but fast loop, and a slower, but more stable loop. A fast loop response is required for fast channel scanning or for fast locking. Thus, a higher ripple frequency allows for a better overall performance. The present invention achieves an a.f.c. control signal with an inherent correct polarity, obviating the need for multiplication with demodulated data, such as in other prior art receivers, e.g. as disclosed in GB 2 180 419. Furthermore, as compared with known receivers using crystal oscillators without applying an a.f.c. control signal thereto, no complicated temperature drift compensation schemes are necessary. E.g., a less than 2.8 ppm temperature drift or aging drift compensation in such known receivers in the 900 MHz band would be expensive or even impractical in paging receivers. The present invention priority using crystals without temperature compensation. The offset frequency detector 17 can be implemented analogly or digitally. For obtaining demodulated data, the direct conversion receiver 1 comprises a demodulator 19 to which the baseband signals I and Q are fed. The demodulator 19 can be a lead-lag phase detector for demodulating FSK data. The demodulator is coupled to a microcontroller 20 with RAM and ROM memory and digital and/or analog I/O-interfaces. Such microcontrollers are well known in the art. For paging transceivers, various output signals may be provided for such as a signal via an amplifier 21 and a speech loudspeaker 22, an information message via a display unit 23, a audible tone signal via a beeper 24, and a visual alert signal via an LED 25. In case of a paging transceiver, allowing for sending a return message, transmission means 26 are provided for, which are controlled by the microcontroller 20, the transmission means being coupled to a transmitting aerial 27.

Figure 2:
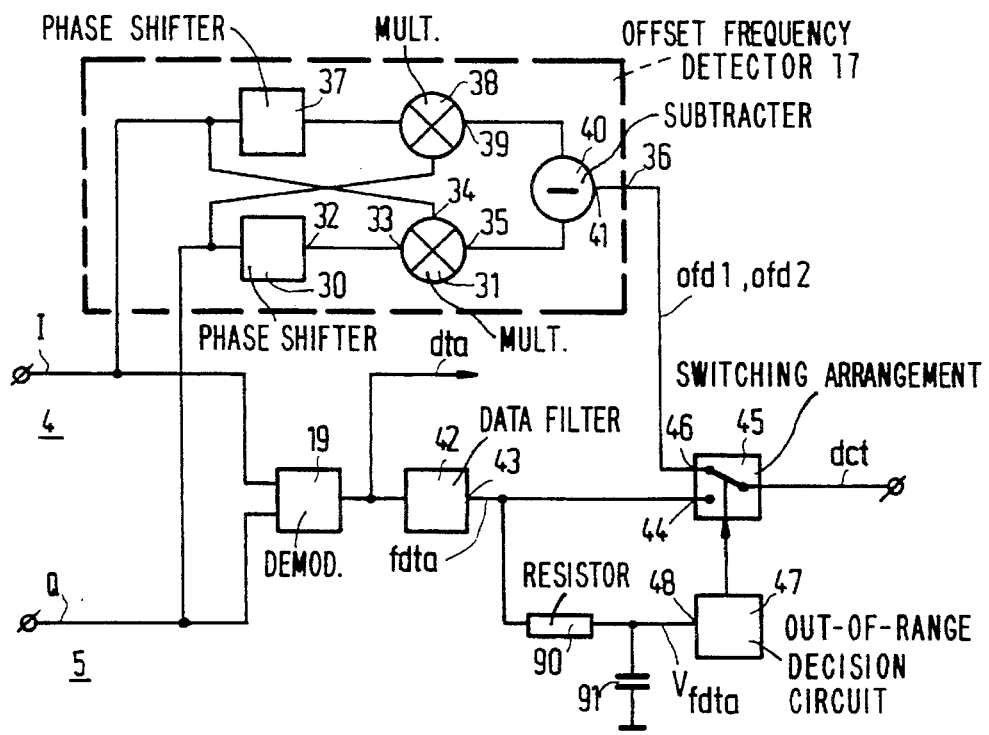
FIG. 2 shows an embodiment of an offset frequency detector and out-of-range detection means according to the present invention.

FIG. 2 shows an embodiment of the frequency effect detector 17 and out-of-range detection means according to the present invention, the same reference numerals having been used for corresponding features. In FIG. 2, unfiltered data dta are available at an output of the demodulator 19. As in the prior art, the said EP 298 484, the offset frequency detector 17 comprises a series arrangement of a phase shifting arrangement 30 and a multiplication arrangement 31 in one quadrature path, e.g. the quadrature path 5 as shown in FIG. 1. In case of one series arrangement the baseband signal Q is fed to the phase shifting arrangement 30 of which an output 32 is coupled to a first input 33 of the multiplication arrangement 31. The baseband signal I is fed to a second input 34 of the multiplication arrangement 31, of which an output 35 forms an output signal ofd1 at an output 36 of the offset frequency detector 17. The baseband signals I and Q may also be interchanged. In case of series arrangements in both quadrature paths according to the present invention, the offset frequency detector 17 further comprises a phase shifting arrangement 37 and a multiplication arrangement 38, being coupled to the baseband signals I and Q as described, i.e. the series arrangements are cross-coupled to the baseband signals I and Q. The output 35 of the multipication arrangement 31 and an output 39 of the multiplication arrangement 38 are fed to a subtracting arrangement 40 for subtracting output signals of the multiplication arrangements 31 and 38. An output 41 of the subtracting arrangement 17 forms an output signal ofd2 at the output 36 of the offset frequency detector 17. The offset frequency detector 17 can be implemented digitally, the phase shifting arrangements 30 and 37 being clocked shift registers, and the multiplication arrangements 31 and 38 being exclusive-OR digital circuits. In case of a single series arrangement, as in the prior an frequency detector, the digital signal dot is a bipolar signal with varying pulsewidth, and in case of the frequency detector according to the present invention having a series arrangement in both quadrature paths together with a subtracting arrangement the digital signal dct is a unipolar signal of which the polarity depends of the sign of the offset frequency $f_L - f_C$. Also, the microcontroller 20 can functionally implement the series arrangements 30, 31 and 37, 38, and subtracting arrangement 40. By applying a well known microcontroller with digital I/O interfaces and digital-to-analog conversion means the a.f.c. signal ct can be fed immediately to the local oscillator 14.

For a.f.c. range-extension, the direct conversion receiver 1 comprises the data demodulation arrangement 19 which provides the demodulated data signal dta, and further a data filter 42 for filtering the demodulated data signal dta, which can be a filter as described in the European Patent Application No. 922021791.8 (PHN 14.107 EP-P), or another data filter. An output 43 of the data filter 42 is coupled to a first input 44 of a switching arrangement 45, the output 36 of the offset frequency detector 17 being coupled to a second input 46 of the switching arrangement 45. The switching arrangement 45, which is controlled by an out-of-range decision circuit 47. An input 48 of the out-of-range decision circuit 47 is coupled to the output 43 of the data filter 42. On the basis of an average level $V_{fdta}$ of the filtered data signal fdta, which is obtained by feeding the filtered data signal to a low pass RC-filter comprising a resistor 90 and a capacitor 91, the decision arrangement 47 decides whether the oscillator frequency $f_L$ falls within a given frequency range around the carrier frequency $f_C$, or outside this given range. If the oscillator frequency $f_L$ falls within the given range, the offset frequency detector 17 provides the digital frequency control signal dct, whereas otherwise the filtered data signal fdta is used as the digital signal dct. The a.f.c. range-extension gives a better result, the more the condition is fulfilled that the number of ones in the received signal rf is equal to the number of zeroes in the signal rf, on the average. The out-of-range decision arrangement may also be a software-based arrangement, at least partially, being comprised within the controller 20. Then the decision can be based upon valid data, and or frequency measurement of the I signal or Q signal, or the product of the I signal and Q signal. A valid data decision can be based upon a valid CRC (Cyclic Redundancy Code, a BER (Bit Error Rate), or the like, or upon a frequency below a threshold frequency. Frequency measurements can be made with a frequency-to-voltage converter inter alia.

Figure 3:
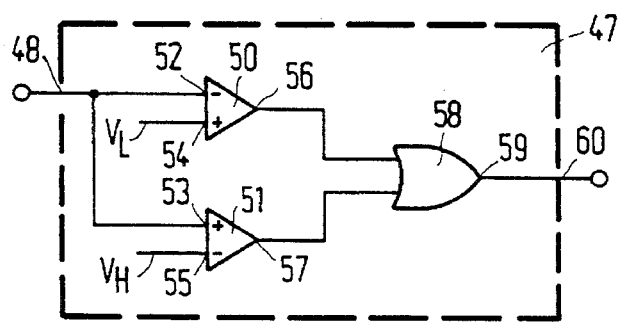
FIG. 3 shows a window comparison arrangement as an out-of-range decision arrangement according to the present invention.

FIG. 3 shows a window comparison arrangement as an out-of-range decision arrangement 47 according to the present invention, comprising a first and a second comparator 50 and 51, a minus input 52 of the comparator 50 being coupled to a plus input 53 of the comparator 51, the coupled inputs 52 and 53 forming the input 48 of the arrangement 47. A low threshold signal $V_L$ is fed to a plus input 54 of the comparator 50, and a high threshold signal $V_H$ is fed to a minus input 55 of the comparator 51. Outputs 56 and 57 of the respective comparators 50 and 51 are coupled to an OR-gate 58 of which an output 59 is coupled to an output 60 of the out-of-range decision arrangement 47. Within each of the comparators 50 and 51 a positive feedback can be applied for giving an hysteresis effect to the threshold signals $V_L$ and $V_H$.

For a further description of a first embodiment of the present invention, in relation to the prior art, FIGS. 4 to 7 show various signals as a function of frequency or time.

Figure 4:
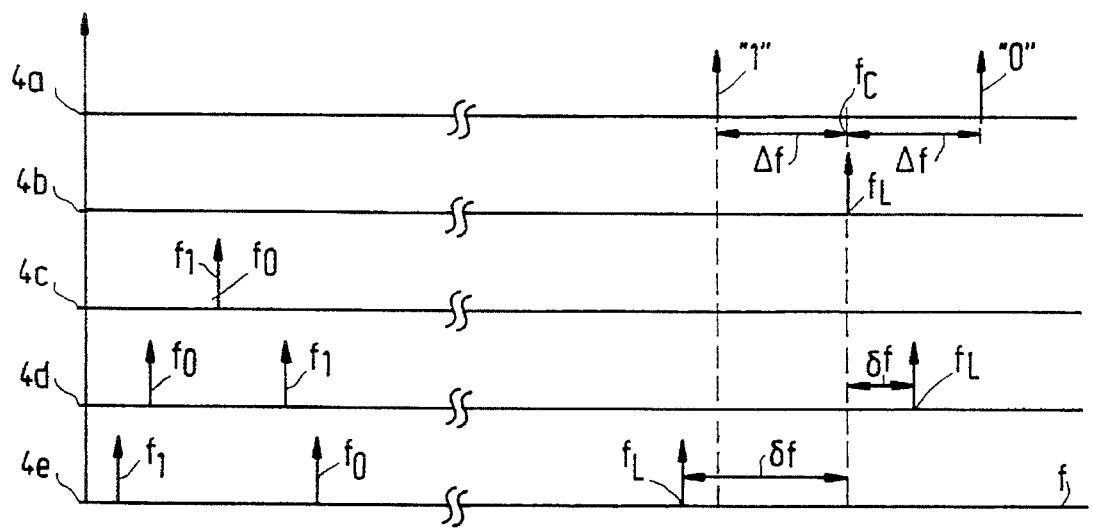
FIG. 4 shows effects on baseband frequencies for various frequency offsets.

FIG. 4 shows effects on baseband frequencies for various frequency offsets as a function of frequency. On line 4a a spectrum for FSK modulated signals in a direct conversion receiver 1 is shown, a logical "1" data signal having a spectral line at a frequency $f_C-\Delta f$, and a logical "0" data signal having a spectral line at a frequency $f_C+\Delta f$, $f_C$ being the nominal carrier frequency, and $\Delta f$ being a frequency deviation, e.g. 4 kHz. On line 4b a situation is displayed where the local oscillator frequency $f_L$ is equal to the nominal carrier frequency $f_C$, giving rise to baseband I and Q signals in the quadrature paths 4 and 5 with the same frequency, though with a different phase. On line 4c a corresponding spectrum is shown, showing a single spectral line for mixed down baseband signals I and Q, both for a "1" and a "0" data signal, indicated with $f_1$ and $f_0$ respectively, both at a frequency $\Delta f$, in the given example at 4 kHz. On line 4d a frequency offset situation is displayed, the local oscillator frequency $f_L$ being higher than the nominal carrier frequency $f_C$ by an amount $\delta f$, but still within a range $f_C-\Delta f$ to $f_C+\Delta f$, $\delta f$ being 2 kHz in the example given. In this situation, the mixed down data signals "1" and "0" appear at $f_1=6$ kHz and $f_0=2$ kHz, i.e. with different frequencies. For a negative offset frequency $\delta f=f_L-f_C$, the mixed down "1" and "0" data signals appear at a lower and a higher frequency, respectively, such a situation being shown on line 4e. Shown is an offset $\delta f=-5$ kHz, $f_1$ being at 1 kHz, and $f_0$ being at 9 kHz. Also shown on line 4e is a situation where the local oscillator frequency $f_L$ is out-of-range. In an embodiment of the present invention, an out-of-range situation is detected by the out-of-range decision arrangement 47, the filtered data signal fdta being the digital signal dct in case of out-of-range, and the offset frequency detector 17 providing the digital signal dct if the oscillator frequency $f_L$ is in-range.

Figure 5A:
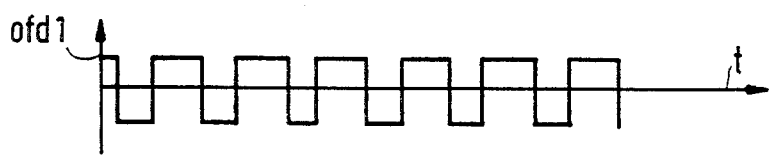
FIG. 5A and 5B show digital output signals of a prior art offset frequency detector and an offset frequency detector according to the present invention, respectively.

FIG. 5A shows the digital output signal ofd1 of a prior art offset frequency detector 17 as disclosed in EP 298 484, having a single series arrangement, as a function of time t. The Q-channel baseband signal Q is delayed by a time delay $t_d$, additional delays occurring of $+\pi/2$ and $-\pi/2$ for "0" and "1" data, respectively. Thus, during a "0" the phase difference between the I-signal and the Q-signal is $+\pi/2$, and during a "1" the phase difference between the I-signal and the Q-signal is $-\pi/2$. The time delay $t_d$ is taken around $1/(2\Delta f)$, i.e. for $\Delta f=4$ kHz, $t_d=125$ μs. The Q-channel delayed signal is multiplied by the I-channel baseband signal I. The digital signal ofd1 is a bipolar signal having a pulse width proportional to the frequency offset $\delta f$, up to $\frac{1}{2}\Delta f$. A correct polarity signal as the control signal ct is obtained by averaging the digital signal ofd1, by means of the filter 18.

Figure 5B:

FIG. 5B shows the digital output signal ofd2 of the offset frequency detector 17 according to the present invention, having two series arrangements and a subtracting arrangement. The digital signal ofd2 can have three values, a positive value as shown, or zero, or a negative value, depending on the frequency offset $\delta f$, i.e. a correct polarity digital signal dct is achieved if the signal ofd2 equates the signal dct. The signal ofd2 has got a considerable higher ripple frequency than the signal ofd1, thus allowing for better loop dynamics.

Figure 6:
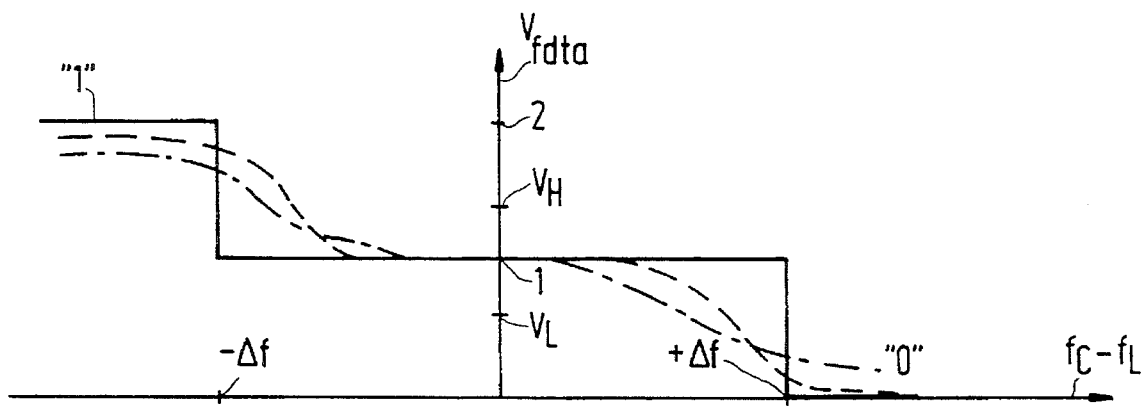
FIG. 6 shows an average of a filtered data signal as a function of a frequency deviation of a local oscillator with respect to a carrier frequency of an FSK signal.

FIG. 6 shows the average level $V_{fdta}$ of the filtered data signal fdta, at the output of the data filter 42, as a function of a frequency deviation of a local oscillator with respect to carrier frequency of an FSK signal, $f_C-f_L=-\delta f$, in a first out-of-range extension embodiment. The average value $V_{fdta}$ is obtained by feeding the filtered data signal fdta to the low pass RC-filter 90, 91. The out-of-range detection is based upon the insight that the better the condition is fulfilled that the average number of zeroes is equal to the average number of ones in the data signal dta, the better the out-of-range detection works. A situation for a paging signal is shown, with a 2 volts signal amplitude for a logical "1" data signal, and a 0 volts signal amplitude for a logical "0" data signal level. If the average signal $V_{fdta}$ is out-of-range, i.e. outside the window $V_H-V_L$, the out-of-range decision arrangement 47, e.g. a window comparison arrangement, switches the signal fdta as the digital signal dct, whereas for an in-window situation, the signal ofd2 is switched as the digital signal dct. In a practical situation, the channel distance between paging signals is e.g. 25 kHz, thus the present invention achieves quite an out-of-range detection. In FIG. 6, various signal conditions are shown. A 0% bit-error-rate or BER is indicated with a solid line, a 3% BER with a dashed line, and a 10% BER with a dotted-dashed line. The BER is taken with respect to a zero offset frequency $\delta f$. It can thus be seen that the out-of-range detection according to the present invention operates over quite a nominal (zero offset frequency) BER, though for a higher BER out-of-range is detected for a smaller frequency deviation. For weaker signals, i.e. with a higher BER, the out-of-range detection is thus less distinctive. It is to be noticed that for paging applications a 3% BER is allowable.

Figure 7:
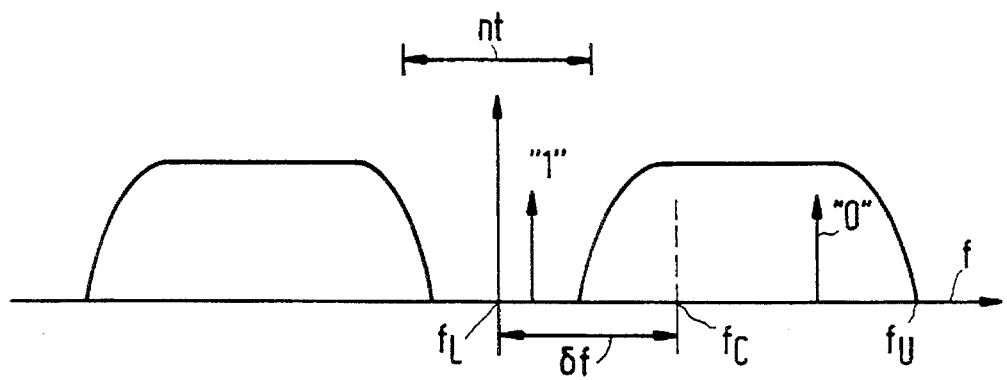
FIG. 7 shows a frequency characteristic of a filter in an embodiment of the present invention.
Figure 8:
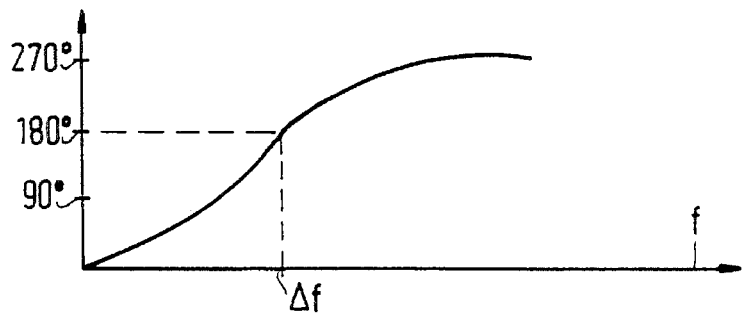
FIG. 8 shows a phase shifting characteristic in an embodiment of the present invention.
Figure 9:
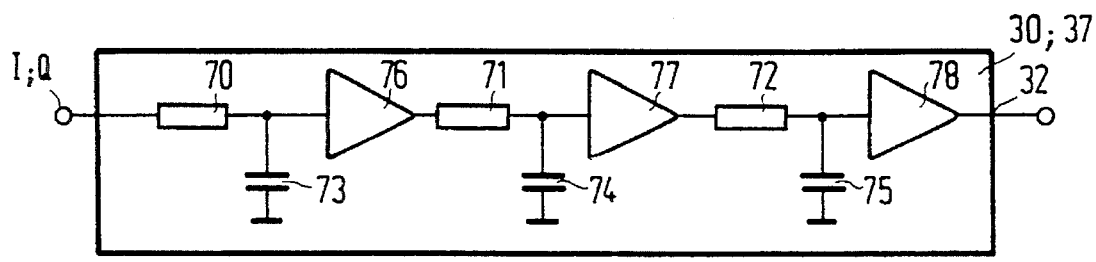
FIG. 9 shows an embodiment of a phase shifting arrangement of the present invention.

FIGS. 7 to 9 show a second out-of-range extension embodiment of the present invention.

FIG. 7 shows a frequency characteristic of the bandpass filters 8 and 12 in an embodiment of the present invention whereby the bandpass filters 8 and 12 implement a frequency gap nt, for a frequency offset $|\delta f|>\Delta f$, $\Delta f$ being the frequency deviation of an FSK rf input signal with respect to the carrier frequency $f_C$. The gap nt in the frequency characteristic, around the oscillator frequency $f_L$, is chosen such that for $\delta f=0$, data "1" and "0" signals just falls outside the gap nt, whereas for the shown frequency offset $\delta f>\Delta f$ the "1" data signal falls within the gap nt. The bandpass filters 8 and 12 can also be filters as usually applied in direct conversion receivers, i.e. with a frequency gap just above DC, the frequency gap according to the present invention then being realized by connecting highpass filters 8A and 12A between the limiters 9 and 13 and the offset frequency detector 17. In the latter case, the frequency gap nt is obtained by the combined filtering action of the filters 8 and 8A, and the filters 12 and 12A, respectively. If $|\delta f|>\Delta f$, the filters 8 and 12, or the combined filters 8 and 8A, and 12 and 12A, suppress a signal which would otherwise pull the a.f.c. into the wrong direction, as in the case of a conventional filter in combination with time delay arrangements as the phase shifting arrangements 30 and 37. The effect is that for $|\delta f|>\Delta f+\epsilon$ the average output signal $V_{av}$ of the offset frequency detector 17 is strongly reduced, $\epsilon$ being the range extension, e.g. $\epsilon=0.5 \Delta f$. For $\Delta f+\epsilon<|\delta f|<2\Delta f$, $V_{av}$ is approximately zero if the number of "1"s is approximately equal to the number of "0"s, on the average, whereas $V_{av}$ is unequal to zero if the number of "1"s is not equal to the number of "0"s, on the average. For $|\delta f|>2\Delta f$, a correct polarity a.f.c. signal is obtained, $V_{av}$ being an average output signal (not shown) of the offset frequency detector 17.

FIG. 8 shows a non-linear phase shifting characteristic for the phase shifting arrangements 30 and 37 in the embodiment of the present invention having the stopband filters as described. Below f=Δf the phase shift increases from 0° to 180°, at f=Δf the phase shifting arrangement 30 and 37 have an 180° phase shift, and for higher frequencies the phase shifting approaches a 270° phase shift. For four RC-filter sections (not shown), the phase shifting approaches a 360° phase shift. In the embodiment given, preferably the limiters 9 and 13 are replaced by a single limiter for limiting the offset frequency detector output signal ofd2.

FIG. 9 shows an embodiment of the phase shifting arrangements 30 and 37 of the present invention, implementing the phase shifting characteristic as shown in FIG. 9. The arrangements 30 and 37 comprise a cascade of three RC-shifting sections with respective resistors 70, 71, and 72, respective capacitors 73, 74, and 75, and respective opamps 76, 77, and 78. A time constant of the filter sections is $\sqrt{3}/(2\pi\Delta f)$, for three filter sections. The arrangements 30 and 37 may also comprise four RC-shifting sections (not shown).

Figure 10:
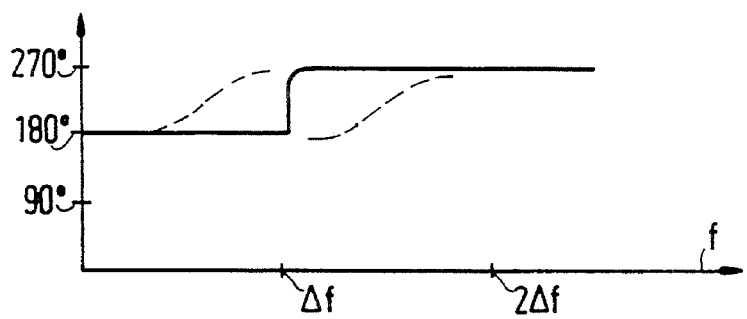
FIG. 10 shows a phase shifting characteristic in another embodiment of the present invention.
Figure 11:
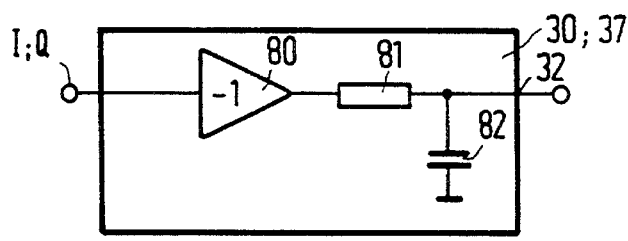
FIG. 11 shows another embodiment of a phase shifting arrangement.

FIGS. 10 and 11 show a third out-of-range extension embodiment of the present invention.

FIG. 10 shows a phase shifting characteristic in another embodiment of the present invention, a wide stopband filter around the the oscillator frequency $f_L$ not being necessary. Ideally the characteristic exhibits a 180° phase shift for f<Δf, and a phase shift of 270° for higher frequencies, but a more gradual phase change will do also, as indicated with a broken line. It holds for δf≠0, that either $|f_0|$ or $|f_1|$<Δf, the other one then greater than Δf. Assuming $|f_0|$<Δf, and $|f_1|$>Δf, during data "0", the phase shift is 180° with $V_{av}$=0, and during data "1", the phase shift is 270° with $V_{av}$ having the correct polarity. Though an a.f.c. gain reduction occurs due to the fact that during data "0" there is no contribution to $V_{av}$, the advantage is that even for Δf<|δf|<2Δf, $f_0$ will not contribute to $V_{av}$, thus ensuring that $V_{av}$ always has the correct polarity. For $|\delta f|$>2Δf, both $f_0$ and $f_1$ can contribute to $V_{av}$ with the correct polarity, and without a.f.c. loop gain reduction, for large enough upper cut-off frequencies $f_u$ of the filters.

FIG. 11 shows another embodiment of the phase shifting arrangements 30 and 37, implementing the phase shifting characteristic as shown in FIG. 10. The arrangements 30 and 37 comprise an inverting amplifier 80, a resistor 81, and a capacitor 82. It has been shown that for various data duty cycles (the number of data "1"s with respect to the number of data "0"s, on the average) and for various 3 dB frequencies of the phase shifting arrangements 30 and 37, e.g. at 0.5Δ, 0.67Δf, Δf, or 2Δf, that a better performance is achieved for an unequal number of "1"s and "0"s, on the average, for larger 3 dB frequencies, the latter giving rise to a smaller δf for a.f.c. in-lock.

I claim:

1. A direct conversion receiver comprising a local frequency generator coupled to a pair of quadrature related signal paths which include mixers for mixing down a received modulated radio frequency (r.f.) signal to derive a pair of quadrature related signals (I, Q) in said signal paths, and an automatic frequency control (a.f.c.) loop coupled to said signal paths for deriving from the quadrature related signals a frequency control signal (ct) for setting the local frequency generator to the carrier frequency of the received r.f. signal; characterized in that said a.f.c. loop includes an offset frequency detector for deriving from the quadrature related signals a frequency offset signal (dct) having an average level which is proportional to an offset of the local frequency generator relative to the carrier frequency of the received r.f. signal, said offset frequency detector comprising:

a first phase shifter and first multiplier means connected in series to a first of said quadrature related signal paths;

a second phase shifter and second multiplier means connected in series to a second of said quadrature related signal paths;

the first multiplier means having a control terminal directly connected to the second signal path, so that a signal (Q) in the first signal path is phase shifted and the phase shifted signal is multiplied by a signal (I) in the second signal path, the second multiplier means having a control terminal directly connected to the first signal path, the control terminals of the first and second multiplier means thereby being directly cross-coupled to respective second and first signal paths, so that a signal (I) in the second signal path is phased shifted and the phase shifted signal is multiplied by a signal (Q) in the first signal path; and means for subtractively combining the multiplied signals produced by said first and second multiplier means, the combined signal so produced being said frequency offset signal (ct), wherein the received r.f. signal is digitally modulated and further comprising:

a demodulator coupled to the quadrature related signal paths for recovering data (dta) from the received digitally modulated r.f. signal;

a data filter coupled to said demodulator for digitally filtering the recovered data;

switching means coupled to said data filter and to said offset frequency detector for controllably selecting, as between the filtered recovered data and the frequency offset signal, which to use for producing said frequency control signal (ct);

an averaging filter coupled to said data filter for deriving a control voltage $V_{fdta}$ corresponding to an average voltage level of the filtered data; and a decision circuit coupled to said averaging filter for receiving said control voltage and which controls said switching means based on evaluation of whether said control voltage corresponds to a frequency offset which is within a predetermined range of the carrier frequency of the received digitally modulated r.f. signal, the switching means being controlled to select said frequency offset signal for frequency control when the frequency offset is within said predetermined range and to select said control voltage for frequency control when the frequency offset is outside said predetermined range.

2. A direct conversion receiver as claimed in claim 1, wherein the received r.f. signal is digitally modulated, said first and second phase shifters are shift registers, and said first and second multiplier means are exclusive-OR logic circuits.

3. A direct conversion receiver as claimed in claim 1, wherein said first and second phase shifters, said first and second multiplier means and said subtractive combining means are all functionally implemented by a microprocessor.

4. A direct conversion receiver as claimed in claim 1, further comprising means coupled to said offset frequency detector for deriving said frequency control signal (ct) from said frequency offset signal (dct) by any of analog integration, digital integration, analog low pass filtering, and digital low pass filtering.

5. A direct conversion receiver comprising a local frequency generator coupled to a pair of quadrature related signal paths which include mixers for mixing down a received modulated radio frequency (r.f.) signal to derive a pair of quadrature related signals (I, Q) in said signal paths, and an automatic frequency control (a.f.c.) loop coupled to said signal paths for deriving from the quadrature related signals a frequency control signal (ct) for setting the local frequency. generator to the carrier frequency of the received r.f. signal; characterized in that said a.f.c. loop includes an offset frequency detector for deriving from the quadrature related signals a frequency offset signal (dct) having an average level which is proportional to an offset of the local frequency generator relative to the carrier frequency of the received r.f. signal, said offset frequency detector comprising:

a first phase shifter and first multiplier means connected in series to a first of said quadrature related signal paths, said first phase shifter having a nonlinear phase shift vs. frequency characteristic;

a second phase shifter and second multiplier means connected in series to a second of said quadrature related signal path, said second phase shifter also having a nonlinear phase shift vs. frequency characteristic;

the first multiplier means having a control terminal connected to the second signal path, so that a signal (Q) in the first signal path is phase shifted and the phase shifted signal is multiplied by a signal (I) in the second signal path, the second multiplier means having a control terminal connected to the first signal path, so that a signal (I) in the second signal path is phased shifted and the phase shifted signal is multiplied by a signal (Q) in the first signal path; and means for subtractively combining the multiplied signals produced by said first and second multiplier means, the combined signal so produced being said frequency offset signal (ct), wherein the received r.f. signal is digitally modulated and further comprising:

a demodulator coupled to the quadrature related signal paths for recovering data (dta) from the received digitally modulated r.f. signal;

a data filter coupled to said demodulator for digitally filtering the recovered data;

switching means coupled to said data filter and to said offset frequency detector for controllably selecting, as between the filtered recovered data and the frequency offset signal, which to use for producing said frequency control signal (ct);

an averaging filter coupled to said data filter for deriving a control voltage $V_{fdta}$ corresponding to an average voltage level of the filtered data; and a decision circuit coupled to said averaging filter for receiving said control voltage and which controls said switching means based on evaluation of whether said control voltage corresponds to a frequency offset which is within a predetermined range of the carrier frequency of the received digitally modulated r.f. signal, the switching means being controlled to select said frequency offset signal for frequency control when the frequency offset is within said predetermined range and to select said control voltage for frequency control when the frequency offset is outside said predetermined range.

6. A direct conversion receiver as claimed in claim 5, wherein said decision circuit evaluates said control voltage with reference to whether it corresponds to a frequency within a predetermined frequency window.

7. A direct conversion receiver comprising a local frequency generator coupled to a pair of quadrature related signal paths which include mixers for mixing down a received modulated radio frequency (r.f.) signal to derive a pair of quadrature related signals (I, Q) in said signal paths, and an automatic frequency control (a.f.c.) loop coupled to said signal paths for deriving from the quadrature related signals a frequency control signal (ct) for setting the local frequency generator to the carrier frequency of the received r.f. signal; characterized in that said a.f.c. loop includes an offset frequency detector for deriving from the quadrature related signals a frequency offset signal (dct) having an average level which is proportional to an offset of the local frequency generator relative to the carrier frequency of the received r.f. signal, said offset frequency detector comprising:

a first phase shifter and first multiplier means connected in series to a first of said quadrature related signal paths, said first phase shifter having a nonlinear phase shift vs. frequency characteristic;

a second phase shifter and second multiplier means connected in series to a second of said quadrature related signal paths, said second phase shifter also having a nonlinear phase shift vs. frequency characteristic;

the first multiplier means having a control terminal connected to the second signal path, so that a signal (Q) in the first signal path is phase shifted and the phase shifted signal is multiplied by a signal (I) in the second signal path, the second multiplier means having a control terminal connected to the first signal path, so that a signal (I) in the second signal path is phased shifted and the phase shifted signal is multiplied by a signal (Q) in the first signal path; and means for subtractively combining the multiplied signals produced by said first and second multiplier means, the combined signal so produced being said frequency offset signal (ct), wherein the respective quadrature paths each include a bandpass filter and a high pass filter which together constitute a stopband filter for a.f.c. out-of-range extension, and the first and second phase shifters have a non-linear phase shift characteristic which approaches a predetermined phase shift with increasing frequency beyond a predetermined frequency offset relative to the carrier frequency of the received r.f. signal.

8. A direct conversion receiver comprising a local frequency generator coupled to a pair of quadrature related signal paths which include mixers for mixing down a received modulated radio frequency (r.f.) signal to derive a pair of quadrature related signals (I, Q) in said signal paths, and an automatic frequency control (a.f.c.) loop coupled to said signal paths for deriving from the quadrature related signals a frequency control signal (ct) for setting the local frequency generator to the carrier frequency of the received r.f. signal; characterized in that said a.f.c. loop includes an offset frequency detector for deriving from the quadrature related signals a frequency offset signal (dct) having an average level which is proportional to an offset of the local frequency generator relative to the carrier frequency of the received r.f. signal, said offset frequency detector comprising:

a first phase shifter and first multiplier means connected in series to a first of said quadrature related signal paths;

a second phase shifter and second multiplier means connected in series to a second of said quadrature related signal paths;

the first multiplier means having a control terminal directly connected to the second signal path, so that a signal (Q) in the first signal path is phase shifted and the phase shifted signal is multiplied by a signal (I) in the second signal path, the second multiplier means having a control terminal directly connected to the first signal path, the control terminals of the first and second multiplier means thereby being directly cross-coupled to respective second and first signal paths, so that a signal (I) in the second signal path is phased shifted and the phase shifted signal is multiplied by a signal (Q) in the first signal path; and means for subtractively combining the multiplied signals produced by said first and second multiplier means, the combined signal so produced being said frequency offset signal (ct), wherein the respective quadrature paths each include a bandpass filter and a high pass filter which together constitute a stopband filter for a.f.c. out-of-range extension, and the first and second phase shifters have a non-linear phase shift characteristic which approaches a predetermined phase shift with increasing frequency beyond a predetermined frequency offset relative to the carrier frequency of the received r.f. signal.

* * * * *